United States Patent [19]
Kachelmeier

[11] Patent Number: 5,897,354
[45] Date of Patent: *Apr. 27, 1999

[54] METHOD OF FORMING A NON-VOLATILE MEMORY DEVICE WITH RAMPED TUNNEL DIELECTRIC LAYER

[75] Inventor: Mark T. Kachelmeier, Austin, Tex.

[73] Assignee: Cypress Semiconductor Corporation, San Jose, Calif.

[ * ] Notice: This patent is subject to a terminal disclaimer.

[21] Appl. No.: 08/768,885

[22] Filed: Dec. 17, 1996

[51] Int. Cl.$^6$ .................................................. H01L 21/336
[52] U.S. Cl. ........................... 438/264; 438/286; 438/981
[58] Field of Search ..................................... 438/263, 264, 438/283, 286, 981, 279, 282, 284, 291, 294, 297

[56] References Cited

U.S. PATENT DOCUMENTS

| | | |
|---|---|---|
| 3,719,866 | 3/1973 | Naber et al. . |
| 3,877,055 | 4/1975 | Fisher et al. . |
| 4,566,175 | 1/1986 | Smayling et al. . |
| 4,611,308 | 9/1986 | Lonky . |
| 4,642,881 | 2/1987 | Matsukawa et al. . |
| 4,709,371 | 11/1987 | West ............................................ 372/44 |
| 4,713,681 | 12/1987 | Beasom .................... 257/336 |
| 4,810,667 | 3/1989 | Zorinsky et al. . |
| 4,868,136 | 9/1989 | Ravaglia . |
| 4,870,304 | 9/1989 | Bloker et al. . |
| 4,878,100 | 10/1989 | McDavid . |
| 4,933,899 | 6/1990 | Gibbs . |
| 4,935,802 | 6/1990 | Noguchi et al. . |
| 4,954,990 | 9/1990 | Vider . |
| 5,027,320 | 6/1991 | Pathak et al. . |
| 5,132,936 | 7/1992 | Keswick et al. . |
| 5,218,571 | 6/1993 | Norris . |
| 5,284,786 | 2/1994 | Sethi . |
| 5,323,039 | 6/1994 | Asano et al. . |
| 5,326,999 | 7/1994 | Kim et al. . |
| 5,357,126 | 10/1994 | Jimenez . |
| 5,381,370 | 1/1995 | Lacey et al. . |
| 5,398,203 | 3/1995 | Prickett, Jr. . |
| 5,429,970 | 7/1995 | Hong . |
| 5,502,321 | 3/1996 | Matsushita . |
| 5,516,717 | 5/1996 | Hsu . |
| 5,741,737 | 4/1998 | Kachelmeier ........................... 438/286 |

OTHER PUBLICATIONS

*Memory 1996*, Jim Griffin et al., Chapters 9 and 10 (Integrated Circuit Engineering Corporation), No month.

*Cypress Semiconductor High Performance Data Book* (10pp. Excerpt), pp. 1–3, May 1995.

*Primary Examiner*—Charles Bowers
*Assistant Examiner*—Jack Chen
*Attorney, Agent, or Firm*—Oblon, Spivak, McClelland, Maier & Neustadt, P.C.

[57] ABSTRACT

The invention relates to a method of forming a non-volatile memory device with a ramped tunnel dielectric layer, in which a floating gate material layer is being oxidized such that a tunnel dielectric layer is formed having a thickness at a drain region edge which is greater than a thickness at a source region edge.

13 Claims, 2 Drawing Sheets

METHOD OF FORMING A NON-VOLATILE MEMORY DEVICE WITH RAMPED TUNNEL DIELECTRIC LAYER

BACKGROUND OF THE INVENTION

Field of the Invention

The invention relates to a non-volatile memory or EPROM device with a ramped tunnel dielectric layer, a memory array containing such a non-volatile memory device, a method of making such a non-volatile memory, a method of programming such non-volatile memory or and a method of reading such a programmed non-volatile memory device.

Discussion of the Background

Metal-oxide-semiconductor (MOS) technology is commonly employed in non-volatile memories, which generally include electronically programmable read-only memories (EPROMs), erasable electronically programmable read-only memories (EEPROMs), and flash memory. One variety, flash memory, can be programmed by hot electron techniques. The entire contents of the flash memory can be erased electronically in a single operation (e.g., universal change by Fowler-Nordheim tunneling).

The general structure of an EPROM memory cell or transistor 10, is shown in FIG. 1. This transistor has a semiconducting substrate 15, a source region 13, a drain region 14, a tunnel dielectric layer on the substrate 16, a floating gate 12, an interpoly dielectric layer 17 on the floating gate and a control gate 11 on said interpoly dielectric layer. The floating gate 12 is electrically isolated from the semiconductor substrate by the tunnel dielectric layer and from the control gate by the interpoly dielectric, and stores information in the form of charge. A flash EPROM is made from a plurality of these transistors, interconnected so that they can be individually programmed, and erased in blocks or groups.

Various flash EPROM devices are known. Examples include the following U.S. Pat. Nos. incorporated herein by reference: 5,429,970, 4,879,304 5,424,991 and 4,789,883. Processing methods for making these devices are also well-known, and are described in *Encyclopedia of Chemical Technology*, Kirk Othmer, volume 14, pp. 677–709 (1995), *Semiconductor Device Fundamentals*, Robert F. Pierret (Addison-Wesley, 1996), and *Microchip Fabrication*, Peter Van Zant (McGraw-Hill, 1990).

EEPROMs are electronically programmable and erasable. One way to program an individual EPROM cell is to apply a voltage between the source and the control gate, as well as a voltage between the source and the drain. The source-drain voltage generates hot electrons that are swept across the channel from the source to the drain. The voltage on the control gate allows hot electrons in the channel to be injected onto the floating gate thereby raising the threshold voltage. The state of the floating gate, on or off, can be determined by applying a voltage between the source and the drain.

An EEPROM memory cell can be erased by removing electrons from the floating gate. This can be accomplished using Fowler-Nordheim tunneling. In this process a voltage is applied between the control gate and the source. This creates an electric field across the tunnel dielectric layer between the floating gate and the source, causing electrons to be removed from the floating gate.

A problem suffered by traditional EEPROMs is the degradation of the tunnel dielectric layer due to introduction of hot electrons. Over time, the cumulative effects of hot electron damage can result in catastrophic failure of the memory device observed as data retention failure. Due to the susceptibility of these devices to catastrophic failure, the reliability of such devices could be improved. While the reliability of some non-volatile memory devices has been increased, such increases in reliability have been at the expense of access speed in writing and programing.

In addition, a reduced amount of current and/or voltage necessary to erase a "floating gate" would be beneficial. Conventional erasure voltages can be substantial.

SUMMARY OF THE INVENTION

Accordingly, one object of the invention is to provide a non-volatile memory (NVM) with a ramped tunnel dielectric layer.

Another object of the invention is to provide an array of non-volatile memory devices with ramped tunnel dielectric layers.

Another object of the invention is to provide a method of making a non-volatile memory device with a ramped tunnel dielectric layer.

Another object of the invention is to provide a method of reading a programmed non-volatile memory device.

Another object of the invention is to provide a method of programming a non-volatile memory device.

These and other objects can be obtained with a non-volatile memory device comprising sequentially:

(a) a semiconductor substrate comprising a source region and a drain region;
(b) a tunnel dielectric layer having a source region edge and a drain region edge;
(c) a floating gate material layer;
(d) an interpoly dielectric layer; and
(e) a control gate material layer,
   wherein said tunnel dielectric layer has a thickness at the drain region edge greater than at the source region edge.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
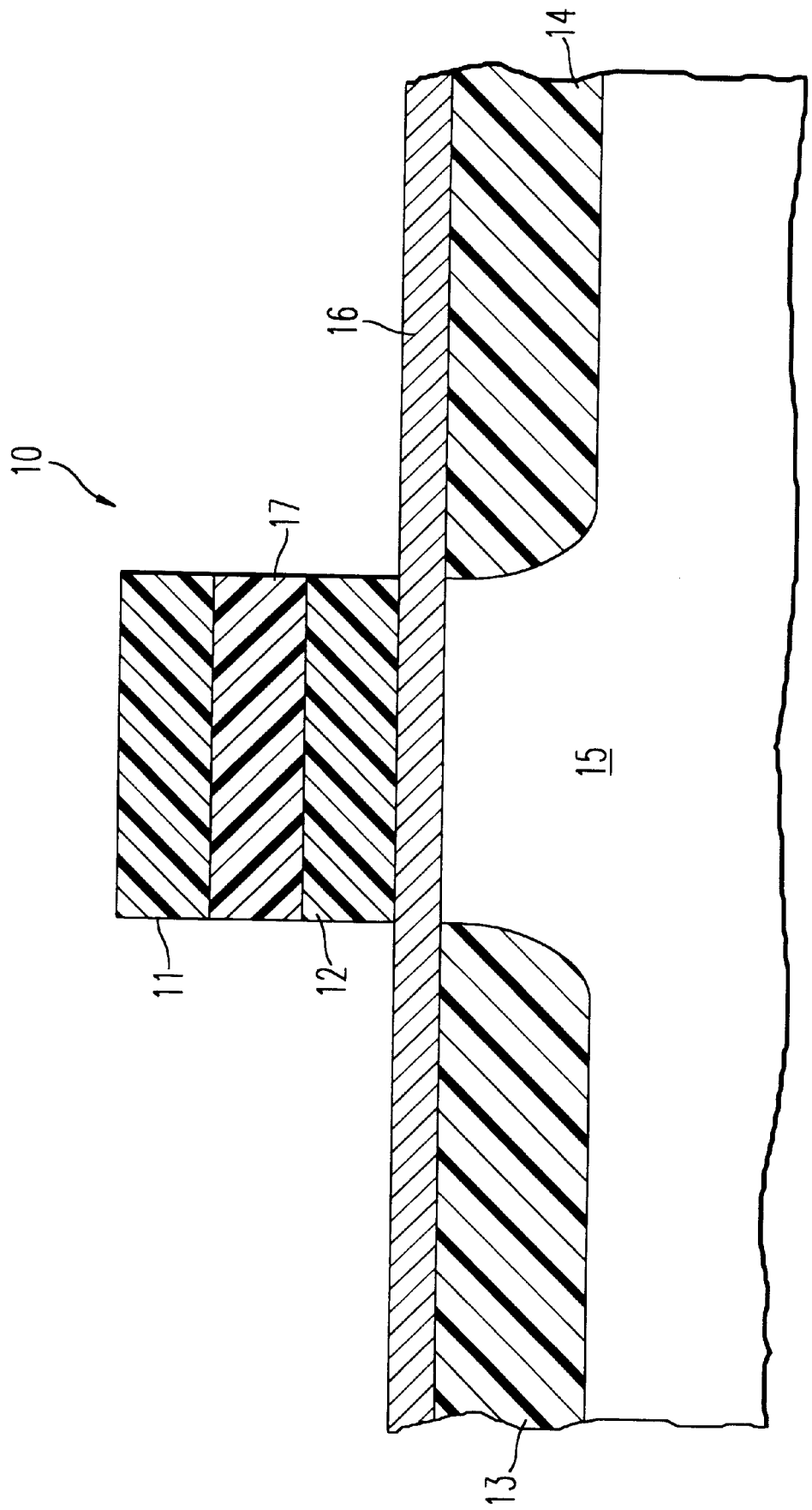
FIG. 1 shows a general structure for a transistor containing a floating gate.
Figure 2:
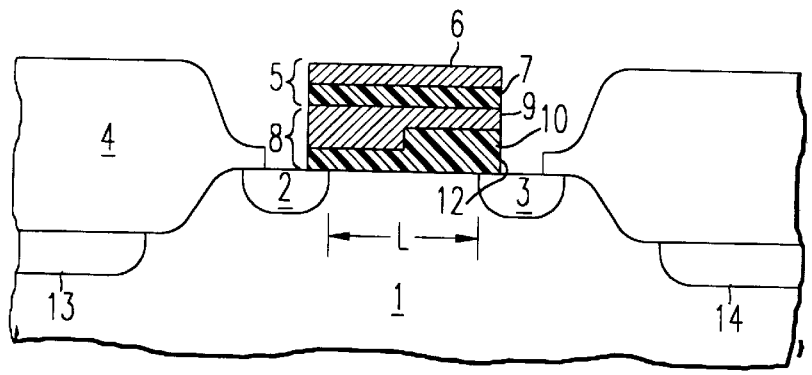
FIG. 2 shows a floating gate transistor having a tunnel dielectric layer thickness which is greater at the drain region edge than at the source region edge.

FIG. 2 depicts a basic non-volatile memory or flash memory device having a ramped tunnel dielectric layer thickness.

A substrate 1, having a source region 2, a drain region 3 and field oxide layer 4, is shown. A control gate system 5, which comprises a control gate material layer 6 and a interpoly dielectric layer 7, is disposed over a floating gate system 8 which comprises a floating gate material layer 9 and a tunnel dielectric layer 10. The control gate and floating gate systems are disposed over a channel between source region 2 and drain region 3. The tunnel dielectric layer 10 has a drain region edge 12 and a source region edge. Optional channel stops 13 and 14 are illustrated. Additional elements such as contact electrodes and passivation layers have been omitted for clarity. Layers 6, 7, 9 and 10 may be layered sequentially on the substrate.

The substrate 1 may be a semiconductor material conventionally known by those of ordinary skill in the art. Examples include silicon, gallium arsenide, germanium, gallium nitride, aluminum phosphide, and alloys such as $Si_{1-x}Ge_x$ and $Al_xGa_{1-x}As$, where $0 \leq x \leq 1$. Many others are known, such as those listed in *Semiconductor Device Fundamentals*, on page 4, Table 1.1 (Robert F. Pierret, Addison-Wesley, 1996). Preferably, the substrate is silicon. Such substrates may be formed epitaxially in accordance with conventional techniques. Doping techniques known to those of ordinary skill in the art may be used to adjust the conductivity properties of the semiconductor substrate. Furthermore, the substrate often may have a top layer of an oxide, such as silicon oxide, to protect the substrate and/or the tunnel dielectric layer of a transistor.

The source and drain regions (2 and 3) may be formed in the substrate by methods well known to those of ordinary skill in the art. Preferably, the substrate or well is p-type and the source and drain regions are n-type.

The floating gate material 9 of the floating gate system 8 may comprise a highly doped polysilicon or amorphous silicon (polysilicon), an alloy of a conductive metal with silicon (a so-called "silicide" such as, for example, titanium silicide, tungsten silicide, aluminum silicide or copper silicide), or a combination thereof. Such combinations may comprise a plurality of layers wherein each layer may comprise or consist of an independently selected floating gate material. The resistivity of silicon can be controlled over a wide range by varying the concentration of impurities such as phosphorous, boron and arsenic, as described in *Microchip Fabrication*, Peter Van Zant, pp 21–42 (McGraw-Hill, 1990). One of ordinary skill in the art is familiar with the amount and kinds of dopants necessary to enable the floating gate polysilicon to perform its desired function. Alternatively, or in addition to, the floating gate material layer may comprise a silicide such as cobalt silicide, hafnium silicide, molybdenum silicide, nickel silicide, palladium silicide, platinum silicide, tantalum silicide, titanium silicide, tungsten silicide, zirconium silicide and chromium silicide. Preferably, the floating gate material layer comprises polysilicon, either doped or undoped.

In a preferred embodiment, the floating gate material layer may be doped with one or more dopants selected from the group consisting of B, P, As and Sb in an amount of $1 \times 10^{18} - 5 \times 10^{21}$ atoms/cm$^3$, more preferably $1 \times 10^{19} - 5 \times 10^{20}$ atoms/cm$^3$.

In a preferred embodiment, the floating gate material layer may have a resistivity of from 25 to 2,000 $\Omega/\square$, more preferably a resistivity of from 150–250 $\Omega/\square$ and even more preferably about 200 $\Omega/\square$. The resistivity may be proportional to the thickness of the layer. For example, a 2,000 Å thick floating gate material layer may have a resistivity of from 150–250 $\Omega/\square$, preferably about 200 $\Omega/\square$. A 1,000 Å thick floating gate material layer may have a resistivity of from 350–450 $\Omega/\square$, preferably about 400 $\Omega/\square$.

The device according to the present invention is similar to a conventional non-volatile memory device except that the thickness of the dielectric layer is greater at the drain region edge than at the source region edge.

The ratio of the tunnel dielectric layer thickness at the drain region edge to the tunnel dielectric layer thickness at the source region edge is >1:1, preferably $\geq 1.1:1$, more preferably $\geq 1.2:1$, most preferably about 1.5:1. In further embodiments, this ratio ranges up to about 100:1, preferably up to about 40:1, more preferably up to about 10:1 and most preferably up to about 4:1.

Preferably, the thickness of the tunnel dielectric layer increases continually from its source region edge to its drain region edge (i.e., in the direction from the source, across the channel, to the drain), such that at any point along the length of the channel, the tunnel dielectric layer thickness on the side of the drain region ($TDt_d$) is greater than or equal to the tunnel dielectric layer thickness on the side of the source region ($TDt_s$), but at one or more such points, $TDt_d > TDt_s$. More preferably, the tunnel dielectric layer thickness, beginning at the source region edge and moving to the drain region edge, across the length of the channel, will increase steadily in a ramped fashion. In other words, there is a gradual increase in the average thickness of the tunnel dielectric layer in the direction from the source region edge to the drain region edge. The dielectric layer separating the floating gate material 9 and the substrate 1 has been called a tunnel dielectric layer even though at the drain edge tunneling is not an issue.

Figure 3:
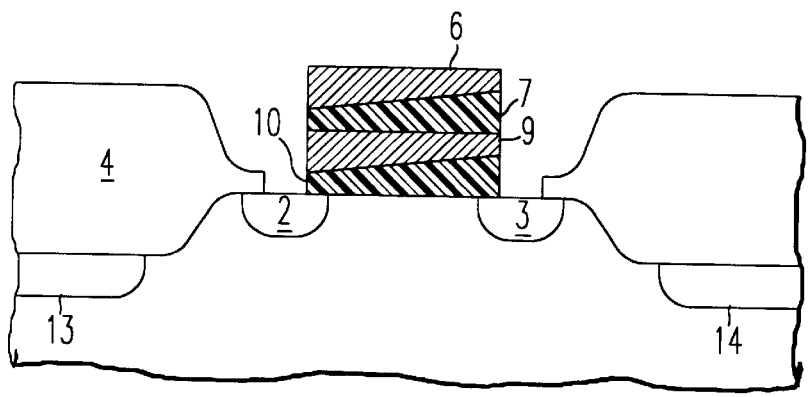
FIG. 3 shows a floating gate transistor having a ramped or tapered tunnel dielectric thickness.
Figure 4:
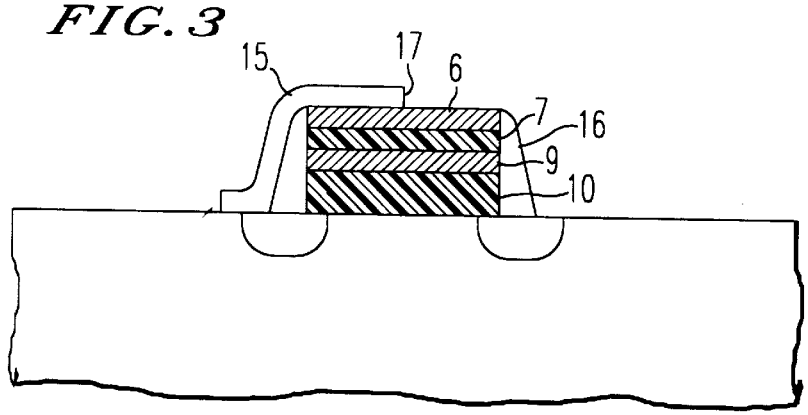
FIG. 4 illustrates a stage in the manufacture of a non-volatile memory in which an oxidation mask is formed over a portion of the control gate, prior to oxidation.
Figure 5:
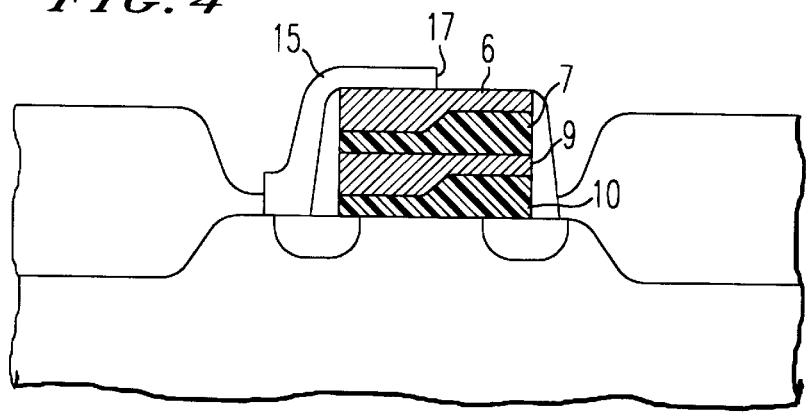
FIG. 5 illustrates a stage in the manufacture of a non-volatile memory in which oxidation of the control and floating gate material layers in the presence of an oxidation mask has been performed.

Within the context of the present invention, FIGS. 2–5 have been provided to illustrate certain aspects of the invention. The specific details of the composition of the floating gate material layer, tunnel dielectric layer, control gate material layer, interpoly dielectric, semiconductor, source and drain regions are not limited by the Figures. In addition, the illustrations in FIGS. 4 and 5 depict the presence of sidewall oxide spacers, the presence of which is optional to the practice of the claimed invention.

The absolute dimensions of the tunnel dielectric layer thickness at the source side (i.e. the source region edge 11) is not particularly limited, and may vary depending on the desired characteristics of the device. Generally, the thickness of the tunnel dielectric layer at the source region edge ranges from 30 to 3000 Å, preferably from 50 to 200 Å, more preferably about 70 to about 100 Å.

The thickness of the tunnel dielectric layer at the drain region edge 12 is not particularly limited, provided that the thickness at the drain region edge 12 is greater than the thickness at the source region edge. Preferably, the thickness at the drain region edge 12 is from 10 to 1,000 Å greater than the thickness at the source region edge, more preferably 20 to 200 Å, and even more preferably 50 to 100 Å.

The tunnel dielectric layer material 10 may be one conventionally known to those of ordinary skill in the art. Non-limiting examples include silicon dioxide, silicon oxynitride ($SiO_xN_y$), metal nitrides (such as $Si_3N_4$), $V_2O_5$, tetraethylorthosilicate-based silicon oxides and titanium oxide. Accordingly, the may not necessarily be an oxide, but may simply be any material functioning as an electrical insulation layer between the floating gate material layer and the substrate. The may be modified by the addition of boron, phosphorous or both. $SiO_2$ and $SiO_2$-based films can be formed from thermal oxides; silane, tetraethoxysilane, borophosphosilicate glass and spin-on-glass. Preferably the tunnel dielectric comprises an oxide of the corresponding floating gate material layer 9. More preferably, the tunnel dielectric layer 10 comprises a silicon dioxide layer and the floating gate material layer 9 comprises polysilicon, which is preferably doped, as described above.

The dimensions of the patterned floating gate material layer and tunnel dielectric layer and the thickness of the floating gate material layer are not particularly limited and may vary depending on the desired performance of the device. Within the context of the present invention, the channel length (illustrated as L in FIG. 2) is the distance between the source and drain regions 2 and 3 and will typically be from 0.1 to 100 $\mu$m, preferably from 0.18 to 10 $\mu$m, more preferably from 0.25 to 2 $\mu$m.

Typically the floating gate material layer will preferably have a thickness (height) of from 500 to 8,000 Å, more preferably from 1,000 to 5,000 Å, even more preferably from 1,500 to about 3,000 Å. The floating gate material layer may have a different thickness at its drain region edge relative to its source region. The floating gate material layer thickness (FGt) may be complementary to the tunnel dielectric layer thickness (TDt) as illustrated in FIG. 2 such that after planarization, at any number of points along the length of the channel, the average sum of FGt+TDt is a Constant (e.g., to two significant figures). However, alternatively the thickness of the floating gate material layer may be uniform across the interface with the tunnel dielectric layer, such that the profile of the floating gate system 8 is thicker at the drain region side than at the source region side.

The channel will also have a width dimension, perpendicular to the plane of the page (the "X-Y" axes) as depicted in FIGS. 2 and 3. The width of the channel may vary depending on the desired electronic characteristics. Typically the channel width ranges from 0.1 to 2,000 $\mu$m, preferably from 0.1 to 1,000 $\mu$m, more preferably from 0.4 to 100 $\mu$M.

The doping of the semiconductor substrate to form source and drain regions 2 and 3 may be conducted by methods known to those of ordinary skill in the art, using materials known to those of ordinary skill in the art for their known purposes. For example, n-type and p-type doping of a semiconductor substrate (which may be light or heavy) may be accomplished by conventional methods known to those of ordinary skill in the art. Dopant species such as arsenic, antimony, phosphorus, and boron may be added by well known techniques such as ion implantation or diffusion. Preferably a p-type substrate is doped to form n-type source and drain regions. Implantation may be followed by annealing and/or "drive-in" steps to deliver the dopant in a desired fashion. Such annealing and drive-in steps may be conducted by conventional methods known to those of ordinary skill in the art. The locations of the source and drain regions may be self-aligned with the floating gate material layer.

The device may also be equipped with a lightly doped n-type extension at the source region. The formation of such a lightly doped n-type extension is conventional and known to those of skill in the art (see for example U.S. Pat. No. 4,356,623, incorporated herewith by reference). An n-type extension on the drain region should not be used, as such would inhibit the programming of the floating gate system.

When a doped extension is incorporated into the device, a sidewall oxide may be added to the wall of the patterned floating gate material layer. The sidewall oxide and floating gate material layer act to align the highly doped region of the source to the floating gate system.

The device of the present invention is equipped with a control gate electrode, disposed over said floating gate material layer, which comprises a control gate material layer and an interpoly dielectric layer.

The interpoly dielectric material 7 may be one conventionally known to those of ordinary skill in the art. Non-limiting examples include silicon dioxide, oxide/nitride/oxide (ONO), silicon oxynitride ($SiO_xN_y$) metal nitrides such as $Si_3N_4$, $V_2O_5$, tetraethylorthosilicate-based oxides and titanium oxide. Accordingly, the interpoly dielectric material need not necessarily be an oxide, but simply function as an insulation layer between the control gate material layer and the floating gate material layer. The interpoly dielectric material 7 may be modified by the addition of boron, phosphorous or both. $SiO_2$ and $SiO_2$-based films can be formed from thermal oxides, silane, tetraethoxysilane, borophosphosilicate glass and spin-on-glass. Preferably the interpoly dielectric material 7 comprises an oxide of the corresponding control gate material layer 6. Preferably, the interpoly dielectric layer 7 comprises an oxide/nitride/oxide (ONO) layer.

The thickness of the interpoly dielectric layer is preferably from 100 to 500 Å, more preferably from 200 to 300 Å.

The control gate material layer 6 may comprise any gate material layer conventionally known to those of ordinary skill in the art Non-limiting examples of control gate material layer include polysilicon and silicides such as cobalt silicide, hafnium silicide, molybdenum silicide, nickel silicide, palladium silicide, platinum silicide, tantalum silicide, titanium silicide, tungsten silicide, zirconium silicide and chromium silicide.

More preferably, the interpoly dielectric 7 comprises an oxide/nitride/oxide (ONO) layer and the control gate material layer 6 is polysilicon, which may be doped or undoped as described above.

The thickness of the control gate material layer is preferably from 1,000 to 5,000 Å, more preferably 2,000 to 4,000 Å, even more preferably about 3,000 Å.

The thickness of the interpoly dielectric layer may be uniform across the interface with the floating gate material layer. In a preferred embodiment, the control gate has an interpoly dielectric layer having a drain region edge and a source region edge and a ramped thickness which is thicker at the drain region edge then at the source region edge.

When the interpoly dielectric has a ramped thickness, the ratio of the interpoly dielectric layer thickness at the drain region edge to the interpoly dielectric layer thickness at the source region edge is >1:1, preferably $\geq$1.1:1, more preferably $\geq$1.2:1, most preferably about 2.5:1. In further embodiments, the upper limit is ratio ranges up to about 100:1, preferably up to about 40:1, more preferably up to about 10:1 and most preferably up to about 4:1.

Preferably, the thickness of the interpoly dielectric layer continually increases from its source region edge to its drain region edge (i.e., in the direction from the source, across the channel, to the drain), such that at any statistically significant number of points along the length of the channel, the average interpoly dielectric layer thickness on the side of the drain region ($IDt_d$) is>the average interpoly dielectric layer thickness on the side of the source region ($IDt_s$), but at one or more such points, $IDt_d$>$IDt_s$. More preferably, the interpoly dielectric layer thickness, beginning at the source region edge and moving to the drain region edge, across the length of the channel, will increase steadily in a ramped fashion. In other words, there is a gradual increase in the thickness of the interpoly dielectric layer in the direction from the source region edge to the drain region edge.

The control gate material layer may have a different thickness at its drain region edge relative to its source region. The control gate material layer thickness (CGt) may be complementary to the interpoly dielectric layer thickness (IDt) as illustrated in FIG. 2 such that after planarization, at any statistically significant number of points along the length of the channel, CGt+IDt=a Constant (e.g., to two significant figures). However, the thickness of the control gate material layer may be uniform across the interface with the interpoly dielectric layer, such that the profile of the control gate system 5 is thicker at the drain region side than at the source region side.

The device may also be equipped with a protection layer, such as a glass layer (e.g., silicate glass, phosphosilicate glass, borophosphosilicate glass, $SiO_xN_y$, etc.). A protective layer may be deposited by conventional methods known to those of ordinary skill in the art, such as by spin-on methods, sintering (which may further include sol-gel oxide formation), chemical vapor deposition, etc. A glass layer deposited by a chemical vapor deposition technique may be subject to a glass reflow step (e.g., by heating) to smooth, densify and further improve the contact between the protection layer and the substrate.

The present transistor may also be equipped with contacts (e.g. electrical contacts) to the source, drain and control gate system, which may be formed by conventional methods known to those of ordinary skill in the art. Examples of suitable contact materials include metals such as aluminum, titanium, zirconium, chromium, molybdenum, tungsten or alloys thereof (e.g., TiW). When the contact is aluminum, alloying of the aluminum with silicon may be conducted to reduce dissolution of source and drain silicon into the aluminum.

The device may also be equipped with one or more passivation layer(s) as desired and/or necessary, comprising a dielectric material such as a silicate (silicon dioxide, tetraethylorthosilicate based oxides, etc., phosphosilicate (phosphate-silicate-glass), borophosphosilicate glass (borophosphate-silicate glass), borosilicate-glass, oxide-nitride-oxide glass, tantalum pentoxide, plasma etched silicon nitride, titanium oxide, silicon oxynitrides etc. Bonding contact masks may be used to expose bonding pads for bonding during assembly. The methods for forming of such passivation layers and bonding pads is conventional and known to those of ordinary skill in the art.

The present non-volatile memory may be incorporated into a semiconductor device such as a memory cell, preferably a non-volatile memory cell such as an EPROM, an EEPROM, a flash memory, etc. The non-volatile memory cell may be further used in a programmable device; a data communications device; etc.

The present non-volatile memory offers advantages over a device having a conventional uniform tunnel dielectric layer, including a ease of erasure, lower stress on the tunnel dielectric layer, better reliability, and ease of maintaining a high drive current.

The present non-volatile memory having a tunnel dielectric layer thickness at the drain region edge greater than at the source region edge may be formed by the following method.

A semiconductor substrate may be provided which comprises a semiconductor bulk layer, an initial oxidation layer, a field oxide and optionally, source and drain channel stops. The initial oxidation layer is labeled in FIG. 4 as layer 10. A field oxide layer on the semiconductor substrate preferably has a thickness of about 2,000–8,000 Å, preferably 3,000–5,000 Å. Doping of the semiconductor bulk layer in order to adjust the conductivity characteristics of the bulk layer may be conducted by conventional methods known to those of ordinary skill in the art. Such a semiconductor substrate may be formed by conventional methods known to those of ordinary skill in the art, such as those methods described in Ruska, *Microelectronic Processing An Introduction to the Manufacture of Integrated Circuits*, McGraw-Hill Books, pp 375–382 (1987).

The floating gate material layer may be deposited directly on the surface of the initial oxidation layer, with formation of the tunnel dielectric layer occurring during a subsequent oxidation step of the floating gate material. The floating gate material is labeled in FIG. 4 as layer 9. The initial oxidation layer and the oxidized floating gate material, together will form the tunnel dielectric layer.

A floating gate material layer may be formed on the surface of the initial oxidation layer in the region over the channel, by conventional methods known to those of ordinary skill in the art. Patterning of the floating gate material layer to form a floating gate system in the region of the channel stops may be conducted by conventional methods known to those of ordinary skill in the art, such as lithographic masking and etching techniques. (See for example Ruska, *Microelectronic Processing An Introduction to the Manufacture of Integrated Circuits*, McGraw-Hill Books, pp 375–382 (1987)).

Suitable floating gate materials are described above, such as polycrystalline silicon, which may be deposited by chemical vapor deposition and/or plasma vapor deposition techniques at a temperature of from 400° to 800°, preferably about 600° C. Doping of the polycrystalline silicon may be performed in accordance with known methods to adjust the conductivity of the floating gate material layer.

Formation of a device having only a ramped tunnel dielectric layer may be conducted at this stage, by selective masking and oxidation, prior to formation of the control gate system. Such a selective masking and oxidation process is analogous to the method which will be described below. However, it is also possible to prepare a device having both a ramped tunnel dielectric layer and a ramped interpoly dielectric layer by depositing an interpoly dielectric layer and a control gate material layer and then selectively masking and oxidizing both the floating and control gate material layers.

A process in which a device has both a ramped tunnel dielectric layer and a ramped interpoly dielectric layer is discussed as follows.

An interpoly dielectric layer (IPDE) is deposited or formed by thermal oxidation by conventional methods known to those of ordinary skill in the art onto a structure having a patterned floating gate layer as described above. The IPDE is labeled in FIG. 4 as layer 7. The IPDE layer may then be masked and etched, and the mask removed, using conventional methods.

A control gate material layer is then deposited onto the interpoly dielectric material and patterned by conventional methods known to those of ordinary skill in the art. The control gate material is labeled in FIG. 4 as layer 6.

An optional sidewall oxide spacer layer (illustrated as 16 in FIG. 4), such as that used for the formation of lightly doped extensions, may be formed along the edges of the gate material layer by conventional methods known to those of ordinary skill in the art. The oxide spacer is formed on at least the side walls of the source and drain region edges of the patterned floating gate material layer, and may completely surround the floating gate material layer. The sidewall oxide material is preferably sufficiently permeable to oxygen to allow for lateral oxidation of the floating gate and/or control gate material layers under the oxidation conditions. Examples of oxide spacer materials include silicon dioxide and/or any other oxide mentioned above, $SiO_2$ being preferred.

A mask (illustrated as 15 in FIG. 4) may be deposited to prevent oxidation of underlying materials. In the present invention, a mask may be selectively deposited and patterned on or over at least the source region edge of the control gate, leaving a region of the control gate material layer at the drain region edge exposed. When sidewall oxide spacers are used, the mask may cover the sidewall oxide spacer at the source region edge. The control gate mask may be formed by conventional deposition and etching and/or developing techniques, known to those of ordinary skill in the art, such as direct patterning or photolithography.

For example, conventional lithographic, etching and/or developing techniques may be used to form desired patterns of a mask, especially the use of photolithographic techniques on a polymer layer photoresist. The use of either positive or negative resist materials may be used. Positive and negative resists, and methods of making the same and using the same to form a mask, are conventional and known to those of ordinary skill in the art.

Etching of deposited films may be conducted by conventional methods known to those of ordinary skill in the art. The specific etching material depends on the material being removed, the resist material and the compatibility of the etching material with the existing structure. Selection of suitable etching materials, resist materials and etching conditions is within the level of skill of those of ordinary skill in the art.

The mask is formed such that a region of the control gate material layer over the transistor drain region is exposed and a region of the control gate material layer over the transistor source region is covered. A masked control gate region is illustrated in FIG. 4.

Mask materials for use in the present invention include those known to those of ordinary skill in the art. Such mask materials may act as a barrier to oxidation. Suitable masks may include conventional positive and negative photoresists and/or a metal nitride layer, such as $Si_3N_4$. $Si_3N_4$ layers may be formed by conventional methods known to those of ordinary skill in the art, such as by chemical vapor deposition techniques. The thickness of the mask may be that sufficient to inhibit oxidation of the material covered by the mask. In the case of a $Si_3N_4$ mask, a layer of 75–150 Å in thickness may be effective to inhibit oxidation of underlying silicon, and at the same time, be used to aid later implantation. Alternatively, the mask layer thickness may be up to 2,500 Å if later implantation is not a concern.

In addition, the mask is deposited so as to inhibit lateral oxidation of the control and floating gate material layers at the source region edge. Accordingly, when sidewall oxide spacers are present, the mask preferably covers the sidewall oxide spacer on the side adjacent to the source region edge.

Doping of the source and drain regions may be conducted by conventional methods known to those of ordinary skill in the art.

A lightly doped n-type extension may be provided at the source by conventional methods known to those of ordinary skill in the art. When incorporated, the lightly doped extension is formed before a sidewall oxide is deposited, but after the preparation of the patterned control and floating gate systems.

The substrate having a mask covering the surface of the control gate material layer closest to the source region and not covering the surface of the control gate material layer closest to the drain region is then oxidized (e.g., subjected to selective oxidation conditions), such that the control and floating gate material layers closest to the drain region are converted to a corresponding oxide while the control and floating gate material layers closest to the source region are not substantially converted to the corresponding oxide.

Oxidation may be conducted by conventional methods known to those of ordinary skill in the art, such as those used for localized oxidation of silicon (LOCOS). Oxidation conditions may include steam oxidation at a temperature of about 700–1,100° C., preferably 700–1,000° C., more preferably 700–900° C. Adjustment of the pressure of oxidation, the density of the oxidant gas and the time of oxidation may be as conventionally known in the art to result in the desired amount of oxidation of the gate material layer.

Steam oxidation results in selective oxidation of the control and floating gate material layers in the region not covered by the mask. Since the control and floating gate material layers at the source region edges are masked with a material which inhibits diffusive oxidation, while the gate material layers at the drain region edges are not masked, non-uniform oxidation of the gate material layers occurs, producing interpoly and tunnel dielectric layers having thicknesses at their drain region edges greater than at their source region edges.

In addition, oxidation of the gate material layers produces an increase in the volume of the interpoly and tunnel dielectric layers, as compared to the volume of the non oxidized control and floating gate material layers, contributing further the difference in thickness between the drain region edge and the source region edge. The phenomenon of lateral encroachment during oxidation and the gradual transition between oxidized and non-oxidized regions has been reported during the formation of field oxide during "localized oxidation of silicon" (LOCOS) and has been referred to as resulting in a "bird's beak". A illustration of the "birds' beak" is provided in FIG. 5. The proportion of the gate dielectric thicknesses, relative to the thicknesses of the gate material layer, as well as the position of the tunnel dielectric layer relative to the mask edge 17 (see FIG. 5) is not necessarily drawn to scale.

In addition, oxidation may be a diffusion-controlled process. Thus, the oxidizing agent(s) may encroach under the edge of the mask covering the source region, providing for formation of interpoly and tunnel dielectric layers with a gradual change in its thickness along an axis perpendicular to the mask edge 17, the channel/source boundary and/or the channel/drain boundary.

The oxidized floating gate material formed from the floating gate material layer may be substantially similar to the initial oxidation layer such that when the initial oxidation layer and the oxidized floating gate material layer are of the same composition, there is no detectable interface between the initial oxidation layer and the oxidized floating gate material layer. Together, the initial oxidation layer and the oxidized floating gate material form the tunnel dielectric layer. The initial oxidation layer and the oxidized floating gate material forming the tunnel dielectric layer are illustrated as layer 10 in FIG. 5.

The oxidized control gate material and the IPDE together form an interpoly dielectric layer with a thickness which is greater on the drain side then on the source side. The oxidized control gate material and the IPDE which together form an interpoly dielectric layer are illustrated in FIG. 5 as layer 7.

After the oxidation of the gate material layers has been performed, the mask may be removed by conventional techniques known to those of ordinary skill in the art. However, it is within the scope of the present invention to leave the mask material in place and conduct further elaboration of the device. Accordingly, a device further comprising a mask disposed over a source edge region is within the scope of the present invention.

A non-volatile memory having only a ramped tunnel dielectric layer may be prepared. Such a device may be prepared by selective masking and oxidation techniques prior to formation of the control gate system. Masking and oxidation would be conducted as described above, on the floating gate material layer alone. After oxidation, the mask may be removed by conventional techniques known to those of ordinary skill in the art. A control gate system having an interpoly dielectric layer of uniform thickness may then be formed by conventional methods known to those of ordinary skill in the art.

After oxidation of the gate material layers to form a floating gate system with a ramped tunnel dielectric layer and a control gate system, further elaboration of the flash memory device may be conducted by conventional methods known to those of ordinary skill in the art. Planarization, formation of contacts to source, drain and gate and passivation may be conducted by conventional methods.

In addition, local interconnects may be formed to conductively connect the source, drain and gate contacts to regions of an integrated circuit. Conventional electrode connectors and/or metal contacts may be added, inserted and/or placed into a semiconductor device containing the present transistor by conventional methods known to those of ordinary skill in the art.

Individual non-volatile memory devices may be combined to provide an array of memory devices, in a conventional electronic configuration known by those of ordinary skill in the art, by conventional methods known to those of ordinary skill in the art.

Individual non-volatile memory devices may also be combined to provide an flash memory device, in a conventional electronic configuration known by those of ordinary skill in the art, by conventional methods known to those of ordinary skill in the art.

An non-volatile memory device according to the present invention may be programmed by conventional hot electron techniques. An EEPROM device according to the present invention, may be programmed by conventional Fowler-Nordheim tunneling. The present flash memory device may be programmed by either of these techniques.

The EPROM can be read and erased in the same fashion as conventional EPROMs. Like conventional EPROMs, the state of the floating gate can be determined by applying a voltage between the source and drain of the transistor containing the floating gate.

Obviously, numerous modifications and variations of the present invention are possible in light of the above teachings. It is therefore to be understood that the invention may be practiced otherwise than as specifically described herein.

What is claimed as new and is desired to be secured by Letters Patent of the United States is:

1. A method of forming a non-volatile memory device comprising:

i) forming a gate mask on a source region edge of a patterned floating gate material layer, leaving a drain region edge of said patterned floating gate material layer exposed; and ii) oxidizing said floating gate material layer such that a tunnel dielectric layer is formed having a thickness at a drain region edge which is greater than a thickness at a source region edge.

2. The method of claim 1, wherein said gate mask is $Si_3N_4$.

3. The method of claim 1, wherein said tunnel dielectric layer comprises a material selected from the group consisting of silicon dioxide, silicon oxynitride ($SiO_xN_y$), metal nitrides, $V_2O_5$, tetraethylorthosilicate-based oxides and titanium oxide.

4. The method of claim 3, wherein said tunnel dielectric layer comprises $Si_3N_4$.

5. The method of claim 1, wherein said floating gate material layer comprises a material selected from the group consisting of amorphous silicon, polysilicon, $WSi_x$, Al, W, Ti, Zr, Mo and TiW alloy.

6. The method of claim 1, wherein said tunnel dielectric thickness from said source region edge to said drain region edge does not decrease, such that at any point along a length of a channel, said tunnel dielectric thickness on the drain region side of said point is $\geq$ the tunnel dielectric thickness on the source region side of said point.

7. The method of claim 1, wherein said drain region edge thickness and said source region edge thickness are in a ratio of >1:1 and $\leq$100:1.

8. The method of claim 7 wherein said ratio is $\geq$1.1:1.

9. The method of claim 1, further comprising forming a control gate comprising an interpoly dielectric layer and a control gate material layer.

10. The method of claim 1, further comprising forming a control gate comprising an interpoly dielectric layer and a control gate material layer, wherein said interpoly dielectric layer comprises a material selected from the group consisting of silicon dioxide, oxide/nitride/oxide (ONO), silicon oxynitride ($SiO_xN_y$), metal nitrides, $V_2O_5$, tetraethylorthosilicate-based oxides and titanium oxide.

11. The method of claim 10, wherein said interpoly dielectric layer comprises $Si_3N_4$.

12. The method of claim 1, further comprising forming a control gate comprising an interpoly dielectric layer and a control gate material layer, wherein said control gate material layer comprises a material selected from the group consisting of amorphous silicon, polysilicon, $WSi_x$, Al, W, Ti, Zr, Mo and TiW alloy.

13. The method of claim 1, further comprising forming a control gate comprising an interpoly dielectric layer and a control gate material layer, wherein said interpoly dielectric layer has a source region edge and a drain region edge and wherein said interpoly dielectric layer has a thickness at the drain region edge greater than at the source region edge.

* * * * *